(12) United States Patent
Huang et al.

(10) Patent No.: US 8,736,012 B2
(45) Date of Patent: May 27, 2014

(54) TRENCHED SEMICONDUCTOR STRUCTURE

(71) Applicant: Taiwan Semiconductor Co., Ltd., Taipei (TW)

(72) Inventors: Chao-Hsin Huang, New Taipei (TW); Chih-Chiang Chuang, New Taipei (TW)

(73) Assignee: Taiwan Semiconductor Co., Ltd., Taipei (TW)

( * ) Notice: Subject to any disclaimer, the term of this patent is extended or adjusted under 35 U.S.C. 154(b) by 12 days.

(21) Appl. No.: 13/737,252

(22) Filed: Jan. 9, 2013

(65) Prior Publication Data

US 2013/0270668 A1    Oct. 17, 2013

(30) Foreign Application Priority Data

Apr. 13, 2012    (TW) .............................. 101206867 A

(51) Int. Cl.
    *H01L 29/872*    (2006.01)
(52) U.S. Cl.
    USPC .................................. 257/476; 257/E29.338
(58) Field of Classification Search
    CPC ................................................... H01L 29/8725
    USPC .................................................. 257/476, 491
    See application file for complete search history.

(56) References Cited

U.S. PATENT DOCUMENTS

| 7,368,353 | B2 * | 5/2008 | Cao et al. .............. 257/E29.257 |
| 7,579,650 | B2 * | 8/2009 | Cao et al. ....................... 257/333 |
| 7,800,185 | B2 * | 9/2010 | Hshieh .......................... 257/401 |

\* cited by examiner

*Primary Examiner* — Chandra Chaudhari
(74) *Attorney, Agent, or Firm* — Rosenberg, Klein & Lee

(57) ABSTRACT

A trenched semiconductor structure comprises a semiconductor substrate, an epitaxial layer, an ion implantation layer, a termination region dielectric layer, an active region dielectric layer, and a first polysilicon layer. The epitaxial layer doped with impurities of a first conductive type is formed on the semiconductor substrate. A plurality of active region trenches and a termination region trench are formed in the epitaxial layer. The ion implantation layer is formed in the active region trenches by doping impurities of a second conductive type. The termination region dielectric layer covers the termination region trench. The active region dielectric layer covers the ion implantation region. The first polysilicon layer covers the active region dielectric layer and fills the active region trenches. The depth of the termination region trench is greater than that of the active region trenches and close to that of the depletion region under reverse breakdown.

17 Claims, 5 Drawing Sheets

TRENCHED SEMICONDUCTOR STRUCTURE

FIELD OF THE INVENTION

The present invention relates to a trenched semiconductor structure, and more particularly to a trenched structure with an epitaxial layer including an active region trenched and a termination region trench with a depth greater than the depth of the active region trenched and close to the depth of depletion region under reverse breakdown.

BACKGROUND OF THE INVENTION

Schottky diode is an important power device featuring a metal-semiconductor junction to create a schottky barrier for the purpose of rectification for a long time. With the characteristics of high switching speed and rectification, the schottky diode has been widely applied to high speed switching power devices, digital computers, and output regulators.

However, the schottky diodes fabricated by using semiconductor structures in present has the disadvantages of low reverse breakdown voltage and large reverse leakage current. In addition, the reverse current increases with increasing temperature to result in the problem of thermal instability. Thus, schottky diode should be operated under the reverse bias much smaller than the rated value, which brings some additional limitations to the application of schottky diode.

In view of the above mentioned problems, various improvements of semiconductor structures have been developed to enhance reverse breakdown voltage and reduce leakage current, and a commonly-used improvement is to form a boron-implanted termination (BIT), which is described below. FIG. 1 shows a cross section view of a conventional semiconductor structure. As shown, the semiconductor structure 1 includes a semiconductor substrate 11, an epitaxial layer 12, an ion implantation layer 13, an active region dielectric layer 14, a polysilicon layer 15, a termination region dielectric layer 16, a schottky barrier layer 17, and a metal electrode layer 18.

The epitaxial layer 12 is formed on the semiconductor substrate 11 and has a plurality of active region trenches 121 (only one of them is labeled) and a termination region 122. These active region trenches 121 are implanted with boron ions so as to form ion implantation layer 13 therein. In addition, the termination region 122 is also implanted with boron ions to form a boron ion implantation layer 1221 therein.

The active region dielectric layer 14 is formed on the inner wall and the bottom of these active region trenches 121, and the polysilicon layer 15 is formed on the active region dielectric layer 14. The termination region dielectric layer 16 includes a TEOS layer 161 and a BPSG layer 162. The schottky barrier layer 17 is formed on the epitaxial layer 12 and the termination region dielectric layer 16, and the metal electrode layer 18 is formed on the schottky barrier layer 17.

Since the impurity concentration of the semiconductor substrate 11 is greater than the epitaxial layer 12, the semiconductor substrate 11 is labeled as N+ and the epitaxial layer is labeled as N−.

Please refer to both FIG. 1 and FIG. 2, wherein FIG. 2 is a schematic view showing a simulation of the convention semiconductor structure. As shown in FIG. 2, the potential line inside the semiconductor structure 1 has a lower voltage level, that is the potential line closer the active region trench 121 and the termination region 122 has a lower voltage level. The potential lines show a contour smoothens longitudinally and converges at the right side of the semiconductor structure 1. It is understood that such structure may result in larger reverse leakage current under high reverse bias voltage such that the ability to withstand reverse breakdown voltage would be reduce. In addition, it is understood according to FIG. 2 that the termination region 122 formed by the implantation of boron ions needs a significant area for gradually lowering the electric field aggregated at the boundary of the active region to smoothen the voltage drop. There should be some room for the improvement of conventional structure to reduce reverse leakage current and enhance reverse breakdown voltage.

The parameters used in the simulation of FIG. 2 are, the depth of these active region trenches 121 is 2.4 µm, the impurity concentration of boron ion implantation within the ion implantation layer 13 is $4e^2$, the impurity concentration of boron ion implantation within the ion implantation layer 1221 in the termination region 122 is $5e^4$, and the thickness of termination region dielectric layer 16 is 7500 Å.

Accordingly, it is believed that people skilled in the art would notice that there exists a problem of high reverse leakage current and low reverse breakdown voltage of the conventional semiconductor structures because the ability to withstand the reverse breakdown voltage of the semiconductor structure would be reduced by the large reverse leakage current under high reverse bias voltage resulted from the implantation of P-type ions in the termination region.

BRIEF SUMMARY OF INVENTION

The technical problem to be resolved and the object of the present invention:

In view of prior art, there exists a problem of high reverse leakage current and low reverse breakdown voltage of the conventional semiconductor structures because the ability to withstand the reverse breakdown voltage of the semiconductor structure would be reduced by the large reverse leakage current under high reverse bias voltage resulted from the implantation of P-type ions in the termination region.

Accordingly, it is a main object of the present invention to provide a trenched semiconductor structure, which features the active region trenches and the termination region trench formed in the epitaxial layer, and a depth of the termination region trench is greater than that of the active region trenches and close to a depth of the depletion region under reverse breakdown.

The technical feature of the present invention for solving the problem:

To resolve the problems of conventional technology, a trenched semiconductor structure is provided in accordance with a preferred embodiment of the present invention. As shown, the trenched semiconductor structure comprises a semiconductor substrate, an epitaxial layer, an ion implantation layer, a termination region dielectric layer, an active region dielectric layer, and a first polysilicon layer. The semiconductor substrate is doped with impurities of a first conductive type having a first impurity concentration. The epitaxial layer is doped with impurities of the first conductive type of a second impurity concentration and is formed on the semiconductor substrate. A plurality of active region trenches is formed in the epitaxial layer. At least a termination region trench is also formed in the epitaxial layer and is away from the active region trenches.

The ion implantation layer is formed in a bottom of the active region trenches by doping impurities of a second conductive type. The termination region dielectric layer covers the termination region trench. The active region dielectric layer covers the ion implantation region in the active region trenches. The first polysilicon layer covers the active region dielectric layer and fills the active region trenches. Wherein the first impurity concentration is greater than the second impurity concentration and a depth of the termination region trench is greater than that of the active region trenches and close to a depth of a depletion region under reverse breakdown.

As a preferred embodiment of the present invention, the termination region dielectric layer in the above mentioned trenched semiconductor structure includes a Tetraethoxysilane (TEOS) layer and a Boron Phosphorous Silicate Glass (BPSG) layer. Wherein the TEOS layer is formed on the inner wall and the bottom of the termination region trench, and the BPSG layer is formed on the TEOS layer. A thickness of the TEOS layer is ranged between 1000 Å and 3000 Å, and a thickness of the BPSG layer is ranged between 4000 Å and 7000 Å.

In addition, as a preferred embodiment, the trenched semiconductor structure further comprises a schottky barrier layer formed on the epitaxial layer and the BPSG layer. Moreover, the trenched semiconductor structure may further comprise a second polysilicon layer formed in the termination region trench and between the BPSG layer and the schottky barrier layer. Metal materials of different barrier height may be selected to form the schottky barrier layer according to the different voltage and leakage current limitations in the specifications. As a preferred embodiment, molybdenum silicide with the barrier height of 0.59 eV is selected to form the schottky barrier layer of 100V devices.

As a preferred embodiment, the above mentioned trenched semiconductor structure further comprises a metal electrode layer, which is formed on the schottky barrier layer, and the metal electrode layer is formed of a combination of a material selected from TiN and TiSi and a material selected from Al and Cu—Al alloy.

In addition, as a preferred embodiment, a thickness of the active region dielectric layer of the trenched semiconductor structure is ranged between 1000 Å and 3000 Å. The active region dielectric layer is a thermal oxide layer composed of silicon dioxide ($SiO_2$).

As a preferred embodiment, an interval between the termination region trench and the closest active region trench of the trenched semiconductor structure is ranged between 0.5 μm and 4 μm, a width of the active region trenches is ranged between 0.6 μm and 1.5 μm, a depth thereof is ranged between 1.5 μm and 3 μm, and a width of the termination region trench is ranged between 5 μm and 25 μm, and a depth thereof is ranged between 5 μm and 12 μm.

In addition, as a preferred embodiment, an ion implantation power of the impurities of the second conductive type is ranged between 30 KeV and 100 KeV, an implantation angle thereof is ranged between 7 and 25 degree, and an impurity concentration thereof is ranged between $1e^{12}$ and $1e^{13}$.

The improvement of the present invention in compared with the prior art:

In view of prior art, there exists a problem of high reverse leakage current and low reverse breakdown voltage of the conventional semiconductor structures because the ability to withstand the reverse breakdown voltage of the semiconductor structure would be reduced by the large reverse leakage current under high reverse bias voltage resulted from the implantation of P-type ions in the termination region.

Accordingly, it is a main object of the present invention to provide a trenched semiconductor structure with active region trenches and a termination region trench formed in the epitaxial layer thereof. A depth of the termination region trench is greater than that of the active region trenches and close to a depth of the depletion region under reverse breakdown so as to achieve the effects of reducing reverse leakage current and increasing reverse breakdown voltage.

The embodiments adopted in the present invention would be further discussed by using the flowing paragraph and the figures for a better understanding.

DETAILED DESCRIPTION OF THE INVENTION

There are various embodiments of the composite regeneration membrane in accordance with the present invention, which are not repeated hereby. The preferred embodiment is mentioned in the following paragraph as an example. It should be understood by those skilled in the art that the preferred embodiments disclosed in the following paragraph are merely an example instead of restricting the scope of the invention itself.

Figure 3:
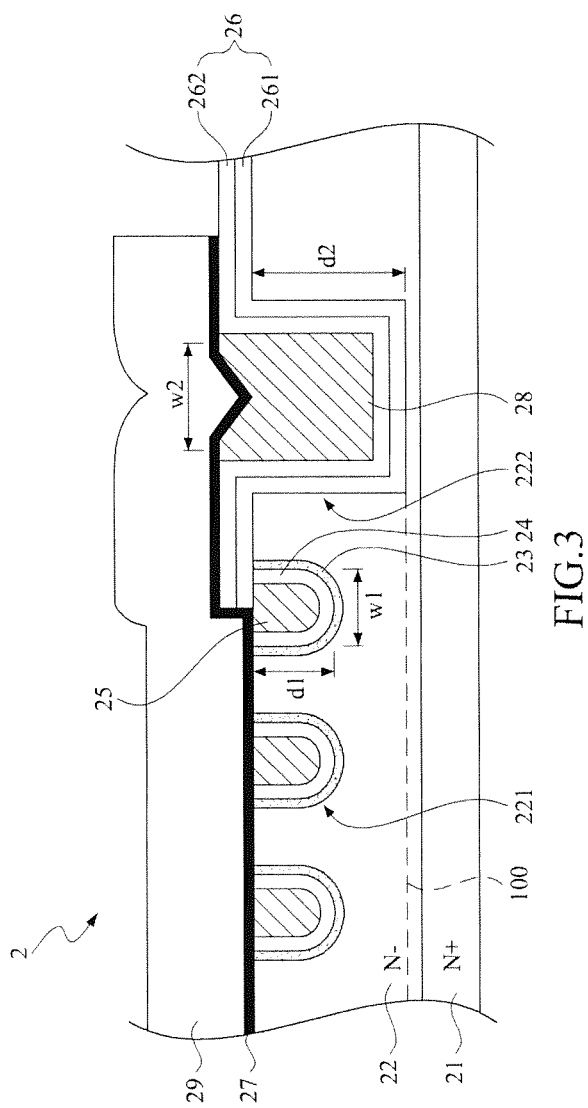
FIG. 3 is a schematic cross section view showing a semiconductor structure in accordance with a preferred embodiment of the present invention.

Referring to FIG. 3, which shows a cross section view of a semiconductor structure in accordance with a preferred embodiment of the present invention. As shown, the semiconductor structure 2 comprises a semiconductor substrate 21, an epitaxial layer 22, a plurality of ion implantation layers 23, an active region dielectric layer 24, a first polysilicon layer 25, a termination region dielectric layer 26, a schottky barrier layer 27, a second polysilicon layer 28, and a metal electrode layer 29.

The semiconductor substrate 21 is doped with impurities of a first conductive type having a first impurity concentration, which might be the heavily doped N-type impurities and is labeled N+ here. The epitaxial layer 22 is formed on the semiconductor substrate 21. The epitaxial layer 22 is doped with impurities of the first conductive type but of a second impurity concentration, which might be the lightly doped N-type impurities and is labeled N− here. To be specific, the first impurity concentration is greater than the second impurity concentration.

The epitaxial layer 22 has a plurality of active region trenches 221 (only one of them is labeled in this figure) and a termination region trench 222 formed therein. The active region trenches 221 are located in the epitaxial layer 22, and the termination region trench 222 is located in the epitaxial layer 22 and is away from the active region trenches 221. As a preferred embodiment, an interval between the termination region trench 222 and the closest one of the active region trenches 221 (the rightmost active region trench 221 in the figure) is ranged between 0.5 μm and 4 μm. In addition, a width w1 of the active region trenches 221 is ranged between 0.6 μm and 1.5 μm, a depth d1 thereof is ranged between 1.5 μm and 3 μm, and a width w2 of the termination region trench 222 is ranged between 5 μm and 25 μm, and a depth d2 thereof is ranged between 5 μm and 12 μm. That is, the depth d2 of the termination region trench 222 is greater than the depth d1 of the active region trenches 221. In addition, the depth d2 is close to that of the depletion region under reverse breakdown, which is the level adjacent to the depletion region curve 100 in this figure.

The ion implantation layers 23 are formed in these active region trenches 221 by doping impurities of a second conductive type into the bottom of these active region trenches 221. The second conductive type impurities are the P-type impurities for example. The ion implantation power for doping the impurities of the second conductive type is ranged between 30 KeV and 100 KeV, an implantation angle thereof is ranged between 7 and 25 degree, and an impurity concentration thereof is ranged between $1e^{12}$ and $1e^{13}$.

The active region dielectric layer 24 covers the ion implantation layers 23 inside the active region trenches 221. As a preferred embodiment, a thickness of the active region dielectric layer 24 is ranged between 1000 Å and 3000 Å. The active region dielectric layer 24 may be a thermal oxide layer for example, which may be composed of silicon dioxide ($SiO^2$). The first polysilicon layer 25 covers the active region dielectric layer 24 and fills these active region trenches 221. The first polysilicon layer 25 is of N-type.

The termination region dielectric layer 26 covers the termination region trench 222 and is partly formed on the epitaxial layer 22. As a preferred embodiment, the termination region dielectric layer 26 includes a Tetraethoxysilane (TEOS) layer 261 and a Boron Phosphorous Silicate Glass (BPSG) layer 262. The TEOS layer 261 is formed on the inner wall and the bottom of the termination region trench 222, and the BPSG layer 262 is formed on the TEOS layer 261. A thickness of the TEOS layer 261 is ranged between 1000 Å and 3000 Å, and a thickness of the BPSG layer 262 is ranged between 4000 Å and 7000 Å.

The schottky barrier layer 27 is formed on the epitaxial layer 22 and the BPSG layer 262. In the present embodiment, molybdenum silicide with a barrier height of 0.59 eV is selected to form the schottky barrier layer 27. The second polysilicon layer 28 is formed in the termination region trench 222 and between the BPSG layer 262 and the schottky barrier layer 27. The metal electrode layer 29 is formed on the schottky barrier layer 27. The metal electrode layer 29 may be formed of a combination of a material selected from TiN and TiSi and a material selected from Al and Cu—Al alloy.

Figure 1:
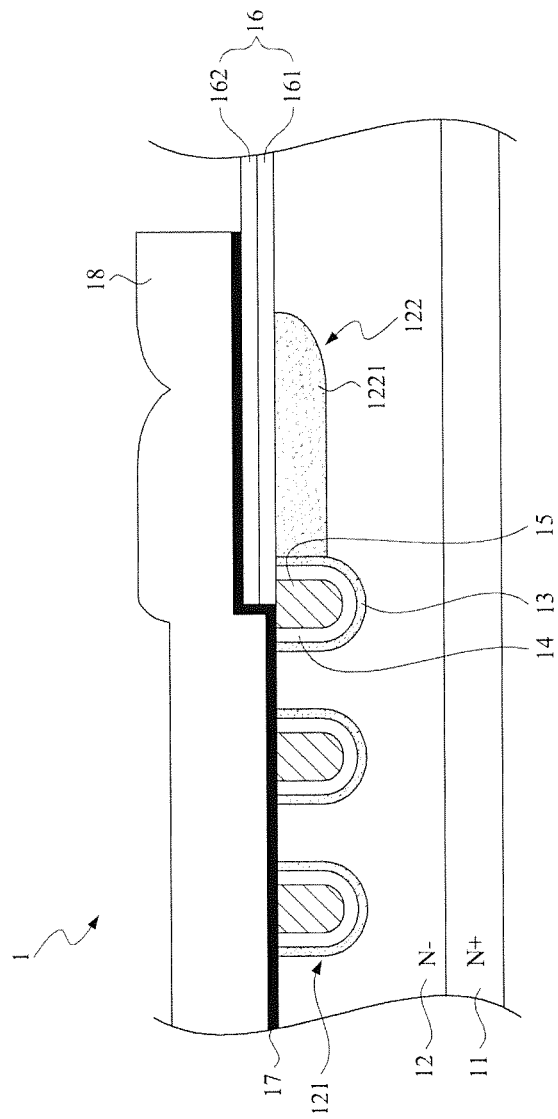
FIG. 1 is a schematic cross section view of a conventional semiconductor structure.
Figure 2:
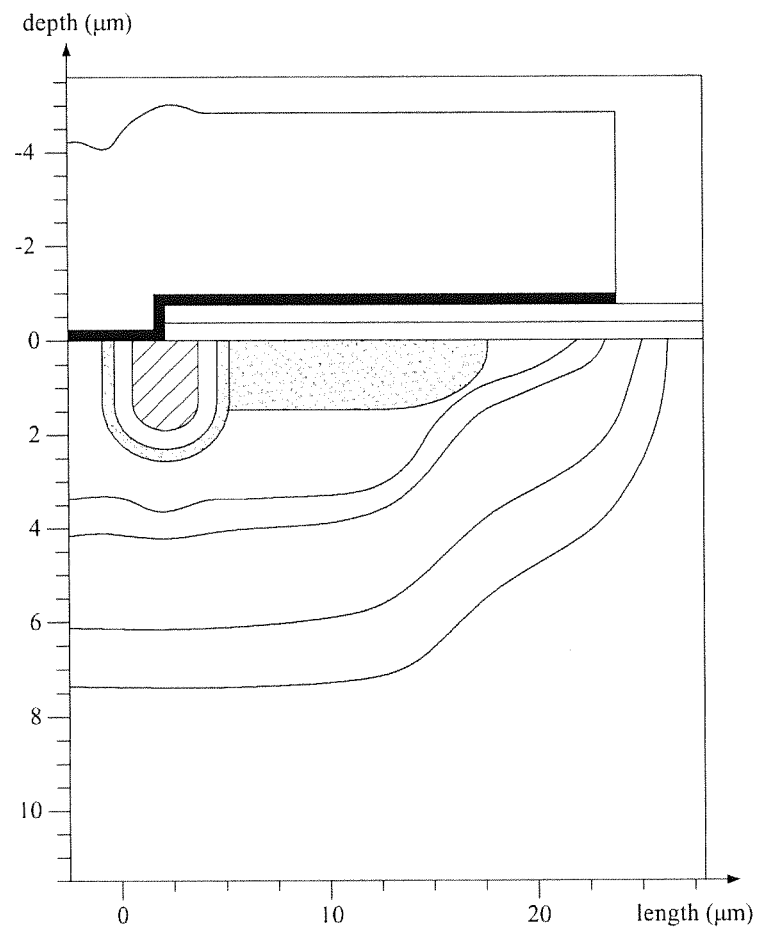
FIG. 2 is a schematic view showing the simulation of the conventional semiconductor structure of FIG. 1.
Figure 4:
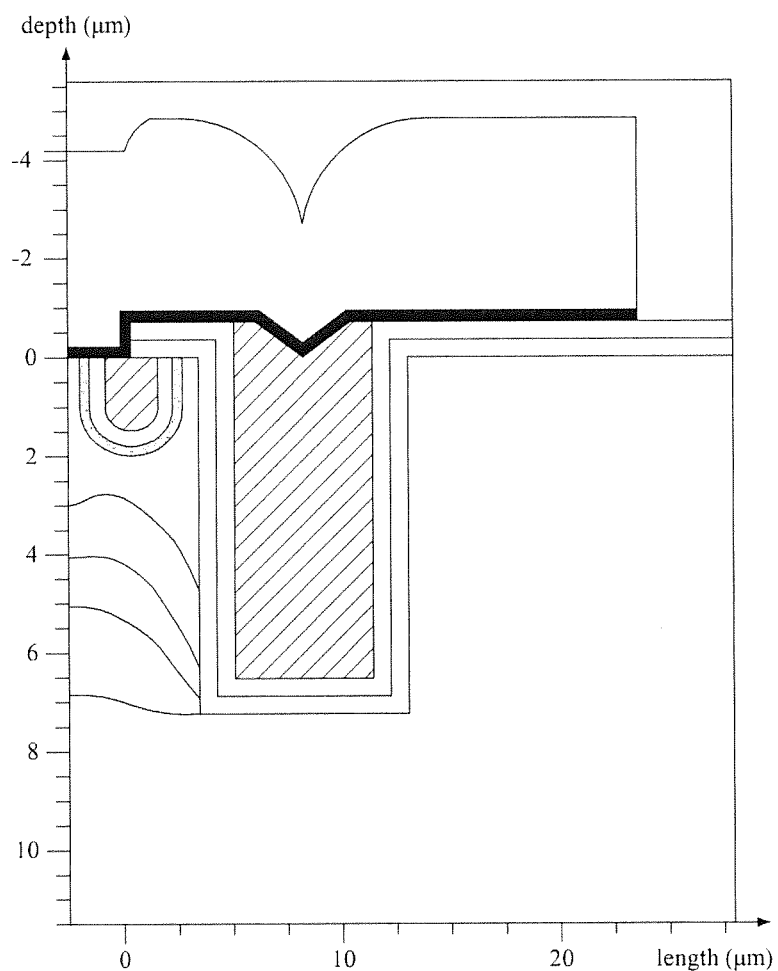
FIG. 4 is a schematic view showing a simulation of the semiconductor structure of the preferred embodiment of FIG. 3.

Please refer to FIG. 2 to FIG. 4, wherein FIG. 4 is a schematic view showing a simulation of the preferred embodiment of the present invention. In the simulation as shown in FIG. 4, the potential line inside the semiconductor structure has a lower voltage level, that is, the potential line closer the active region trenches 221 and the termination region trench 222 has a lower voltage level. In addition, the potential lines show a contour smoothens longitudinally and converges at the termination region trench 222 of the semiconductor structure 2. In compared with the conventional semiconductor structure of FIG. 2, it is understood specifically that such a distribution of the potential lines of the semiconductor structure in accordance with the present invention is helpful for reducing reverse leakage current and increasing reverse breakdown voltage effectively.

Figure 5:
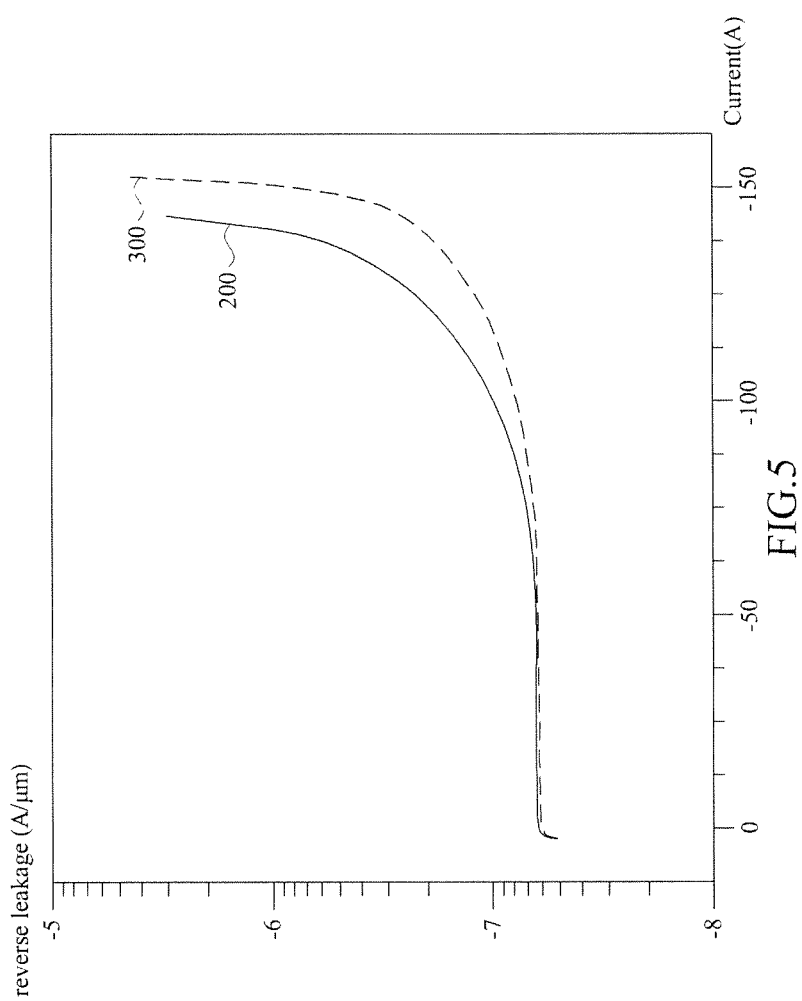
FIG. 5 is a schematic view showing a comparison of reverse breakdown voltage and leakage current of the conventional art and the preferred embodiment of the present invention.

Please referring to FIG. 5, which schematically shows the resulted reverse breakdown voltage and the leakage current of the preferred embodiment of the present invention in compared with the conventional art. As shown in FIG. 5, the first characteristic curve 200 shows the simulation of the conventional semiconductor structure and the second characteristic curve 300 shows the simulation of the semiconductor structure in accordance with the preferred embodiment of the present invention. It is understood that the semiconductor structure of the present invention has a lower reverse leakage current and a higher reverse breakdown voltage. In detail, if the leakage current is kept constant, the semiconductor structure of the present invention has a higher reverse breakdown voltage in compared with the conventional semiconductor structure. If the reverse breakdown voltage is kept constant, the semiconductor structure of the present invention has a lower reverse leakage current in compared with the conventional semiconductor structure.

It is noted that the data presented in FIG. 5 is based on the parameters used in the simulation of FIG. 4 and FIG. 2. These parameters are, the depth of these active region trenches 121 is 2.4 μm, the impurity concentration of boron ions implanted into the ion implantation layers 13 in the active region trenches 121 is $4e^{12}$, the impurity concentration of the termination region 122 fabricated by ion implantation is $5e^{14}$, the depth of the termination region trench 222 is 7.4 μm, and the thickness of the termination region dielectric layer 16, 26 is 7500 Å.

In conclusion, the semiconductor structure provided in the present invention is able to achieve the effects of reducing reverse leakage current and increasing reverse breakdown voltage. In addition, by using the termination region trench, the area needed for lowering the potential in the active region can be significant reduced such that a smaller chip size can be used without affecting any operational characteristics of the semiconductor device. Such advantage is helpful for the present invention to be widely used in high voltage devices. Moreover, because the semiconductor structure of the present invention characterized with a lower reverse leakage current and the uniformity of depth of the termination region trench can be adjusted by the etching process, thus, the yield of the fabrication process can be promoted to reduce the fabrication cost.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A trenched semiconductor structure, comprising:
   a semiconductor substrate doped with impurities of a first conductive type having a first impurity concentration;
   an epitaxial layer doped with impurities of the first conductive type of a second impurity concentration, formed on the semiconductor substrate;
   a plurality of active region trenches, formed in the epitaxial layer;
   at least a termination region trench, formed in the epitaxial layer and away from the active region trenches;
   an ion implantation layer, formed in a bottom of the active region trenches by doping impurities of a second conductive type;
   a termination region dielectric layer, covering the termination region trench;
   an active region dielectric layer, covering the ion implantation region in the active region trenches; and
   a first polysilicon layer, covering the active region dielectric layer and filling the active region trenches;

wherein, the first impurity concentration is greater than the second impurity concentration, and a depth of the termination region trench is greater than that of the active region trenches and close to a depth of a depletion region under reverse breakdown.

2. The trenched semiconductor structure of claim 1, wherein the termination region dielectric layer comprises a Tetraethoxysilane (TEOS) layer and a Boron Phosphorus Silicate Glass (BPSG) layer.

3. The trenched semiconductor structure of claim 2, wherein the TEOS layer is formed on an inner wall and a bottom of the termination region trench.

4. The trenched semiconductor structure of claim 2, wherein the BPSG layer is formed on the TEOS layer.

5. The trenched semiconductor structure of claim 2, wherein a thickness of the TEOS layer is ranged between 1000 Å and 3000 Å, and a thickness of the BPSG layer is ranged between 4000 Å and 7000 Å.

6. The trenched semiconductor structure of claim 2, further comprising a schottky barrier formed on the epitaxial layer and the BPSG layer.

7. The trenched semiconductor structure of claim 6, further comprising a second polysilicon layer formed in the termination region trench and interposed between the BPSG layer and the schottky barrier layer.

8. The trenched semiconductor structure of claim 6, wherein the schottky barrier layer is formed of Molybdenum silicide.

9. The trenched semiconductor structure of claim 6, further comprising a metal electrode layer, formed on the schottky barrier layer.

10. The trenched semiconductor structure of claim 9, wherein the metal electrode layer is formed of a combination of a material selected from TiN and TiSi and a material selected from Al and Cu—Al alloy.

11. The trenched semiconductor structure of claim 1, wherein a thickness of the active region dielectric layer is ranged between 1000 Å and 3000 Å.

12. The trenched semiconductor structure of claim 1, wherein the active region dielectric layer is a thermal oxide layer.

13. The trenched semiconductor structure of claim 12, wherein the thermal oxide layer is formed of $SiO_2$.

14. The trenched semiconductor structure of claim 1, wherein an interval of the termination region trench and the closest active region trench is ranged between 0.5 μm and 4 μm.

15. The trenched semiconductor structure of claim 1, wherein a width of the active region trenches is ranged between 0.6 μm and 1.5 μm, and a depth thereof is ranged between 1.5 μm and 3 μm.

16. The trenched semiconductor structure of claim 1, wherein a width of the termination region trench is ranged between 5 μm and 25 μm, and a depth thereof is ranged between 5 μm and 12 μm.

17. The trenched semiconductor structure of claim 1, wherein an ion implantation power of the impurities of the second conductive type is ranged between 30 KeV and 100 KeV, an implantation angle thereof is ranged between 7 and 25 degree, and an impurity concentration thereof is ranged between $1e^{12}$ and $1e^{13}$.

* * * * *